United States Patent [19]

Folino

[11] 4,454,371

[45] Jun. 12, 1984

[54] SOLAR ENERGY CONCENTRATOR SYSTEM

[75] Inventor: Frank A. Folino, Brookline, Mass.

[73] Assignee: The United States of America as represented by the Secretary of the Air Force, Washington, D.C.

[21] Appl. No.: 326,972

[22] Filed: Dec. 3, 1981

[51] Int. Cl.³ ............................................ H01L 31/04
[52] U.S. Cl. .................................... 136/246; 126/438
[58] Field of Search ................ 136/246, 248; 126/438

[56] References Cited

U.S. PATENT DOCUMENTS

| 3,998,206 | 12/1976 | Jahn | 126/438 |
|---|---|---|---|
| 4,050,444 | 9/1977 | Dolamore | 126/438 |
| 4,071,017 | 1/1978 | Russell et al. | 126/424 |
| 4,086,485 | 4/1978 | Kaplow et al. | 250/203 R |
| 4,110,122 | 8/1978 | Kaplow et al. | 136/249 |
| 4,120,565 | 10/1978 | Rabl et al. | 350/286 |
| 4,128,732 | 12/1978 | Kaplow et al. | 136/246 |
| 4,131,485 | 12/1978 | Meinel et al. | 136/259 |
| 4,144,095 | 3/1979 | Mlavsky | 136/246 |
| 4,241,726 | 12/1980 | Doebel | 126/438 |

OTHER PUBLICATIONS

B. D. Shafer et al., "Low-Cost, High Performance, Point-Focus Concentrator Array Design", *Conf. Record, 14th IEEE Photovoltaic Specialists Conf.* (1980), pp. 754–759.

M. J. O'Leary et al., "Thermal-Electric Performance Analysis for Actively Cooled, Concentrating Photovoltaic Systems," *Solar Energy*, vol. 25, pp. 401–406 (1980).

*Primary Examiner*—Aaron Weisstuch
*Attorney, Agent, or Firm*—Donald J. Singer; Jacob N. Erlich

[57] ABSTRACT

A solar energy concentrator system having a plurality of concentrator arrays with each of the arrays being made up of a plurality of adjacent longitudinally extending concentrator modules. Each of the concentrator modules has a semi-cylindrically-shaped housing and a semi-cylindrically-shaped cover in order to form an overall cylindrically-shaped structure which provides protection from adverse environmental conditions and withstands high wind loads. Situated within the cover and connected to the housing is a parabolically-shaped concentrator. The concentrator is made up of a plurality of parallelogram-shaped reflector panels mounted adjacent one another on a bias. This arrangement permits the ends of the panels to overlap adjacent modules so as to provide a substantially continuous reflector surface. The reflector surface redirects solar energy onto a plurality of solar cells located within the cover and as a result of the physical makeup of the concentrator components substantially eliminates the problem of cell shadowing.

9 Claims, 10 Drawing Figures

SOLAR ENERGY CONCENTRATOR SYSTEM

STATEMENT OF GOVERNMENT INTEREST

The invention described herein may be manufactured and used by or for the Government for governmental purposes without the payment of any royalty thereon.

BACKGROUND OF THE INVENTION

This invention relates generally to solar energy concentrators, and, more particularly to an improved solar energy concentrator system which incorporates therein a totally enclosed novel solar concentrator capable of operating in a highly reliable and efficient manner.

With the increased cost encountered for the production of energy, as a result of, for example the depletion of fossil fuels as a source of energy, more and more effort has been directed toward utilizing the energy of the sun as a means of producing an alternate source of usable energy. A recently developed technique utilizes photovoltaic cells in a solar energy system for directly converting sunlight into electricity. Such a system generally comprises a field of parabolic trough solar concentrators that direct sunlight onto receiver tubes mounted with photovoltaic cells that run the length of the concentrators. The photovoltaic cell, which has the property of converting sunlight directly into electricity, feeds the electricity through a conversion unit into a local utility grid from which power can be drawn.

Unfortunately, because of the relative movement between the earth and the sun, the angles of the incident rays from the sun upon the concentrators continuously vary. To accommodate this continuous change, various movable arrangements of mirrors have been coupled with various control means to cause these mirrors to automatically track the sun as the earth rotates, the energy then being concentrated at a fixed receiver. There are disadvantages in these types of arrangements for large scale production of heat, and these include the high cost of mechanically supporting the structures, many of which are complex, for effective operation.

An even more pressing cause for concern in systems utilizing photovoltaic cell arrays is a phenomena called cell shadowing. This phenomena occurs at the ends of concentrator modules. Basically, these end effects (cell shadowing) are due to the systems requirement to combine a plurality of concentrator modules into a concentrator array. Inherent in such systems are voids located between neighboring concentrator modules of an array. These voids effectively shadow the photovoltaic cells that are dependent upon the irradiated solar flux of the non-existent reflector surface.

Stated more succinctly, reflectors which have been built to date are designed in a rectanglar configuration with straight sides normal to the focal axis of the reflector. Accordingly, the void caused by neighboring reflectors of adjacent concentrator modules is a right circular parabolic segment which would have focused the incident energy at one point on the photovoltaic cell if the reflector surface was present. The lack of reflected energy at that point results in what is known as a shaded area and creates the cell shadowing described above.

In the case, for example, where a concentrator module incorporates therein thirty-six photovoltaic cells, if only one such cell were shaded 50% of the time, the current output of the entire thirty-six series connected string of cells would be reduced approximately 40%. In effect, the shadowing current limits the solar conversion capability of the cell, after which the cell current limits the string of cells which are connected in series. If this string represents a significant part of the photovoltaic receiver, it is readily apparent that there would be a serious power loss.

To overcome the possible shortcoming due to shading of cells, shunting diodes have been installed for each cell so that as current drops to a predetermined level, the shunt becomes active and drops the shaded cells out of the series circuit. There would, however, still be a power loss of about 3% in a thirty-six string receiver. The converse is also true, as the shading is removed the current increases until it reaches the shunting value beyond which it automatically comes on line.

Although solar energy systems utilizing shunting diodes are more effective than those that do not, their use within the system is not only extremely costly but also still produces systems which contain power losses of about 3%. Furthermore, with the addition of the shunting diodes within the system a new source of malfunction can occur within the system, and, if a diode fails, a drastic reduction in energy output can result. Such a problem may require a complete shutdown of the system in order to find and replace the failing diode.

An additional drawback associated with currently available solar energy systems is the inability to keep the system clean so as to utilize maximum solar energy input. Furthermore, the concentrator modules are cumbersome and therefore must be shut down under high wind conditions in which the structure is adversely affected by the surrounding environmental conditions. In instances in which the system is to be operational full time substantial expense is involved in order to increase the structural rigidity of the system in order to maintain alignment of the concentrators with the sun even under extreme environmental conditions.

It is therefore clearly evident from the above description that although solar energy concentrator systems are potentially a highly desirable means for providing usable energy, there are still many drawbacks associated with such systems. It would therefore be beneficial to provide a solar energy concentrator system which is capable of substantially eliminating the problems encountered with past solar energy systems.

SUMMARY OF THE INVENTION

The instant invention provides an improved solar energy concentrator system which is capable of producing a substantial amount of usable energy and overcomes the problems set forth in detail hereinabove.

The solar energy concentrator system of this invention incorporates therein a plurality of totally enclosed novel concentrator modules which when combined in series form a concentrator array which substantially eliminates the troublesome end effects generally associated with photovoltaic cells. The system of this invention is made up of a plurality of rows of such interconnected concentrator modules which are rotatable for maximum efficiency, and because of the completely enclosed structure protects the photovoltaic cells and concentrators from the external environment.

More specifically, each concentrator of each module is made up of plurality reflector panels, with each panel designed in the shape of a parallelogram and mounted adjacent one another on a bias. As a result thereof, the parallelogram-shaped reflector panels overlap adjacent modules in order to produce a concentrator array which forms a totally intergrated contiguous reflective surface capable of re-directing incoming solar energy to all the receiver cells at a nearly uniform level of illumination. The flux distribution is uniform across the image width as well as the cell strings of the receiver.

Shading at the module interface has been modulated by the bias panel design resulting in this loss being distributed over the length of a cell string rather than a single cell. Consequently, power loss due to shading or cell mismatch has been essentially eliminated so that anticipated cell efficiency and cell string performance are maintained. The need for shunting diodes or complex circuitry for cutting out shaded cells will therefore be substantially eliminated.

It is therefore an object of this invention to provide an improved solar energy concentrator system which substantially increases the amount of usable energy which can be derived therefrom.

It is another object of this invention to provide an improved solar energy concentrator system which eliminates the adverse effects encountered in the past by cell shadowing.

It is a further object of this invention to provide an improved solar energy concentrator system which is totally enclosed and therefore protects the components thereof from adverse environmental conditions.

It is still another object of this invention to provide an improved solar energy concentrator system which is formed of an aerodynamically designed configuration in order to enable the system to withstand high wind loads.

It is still a further object of this invention to provide an improved solar energy concentrator system which incorporates therein a very efficient structural design thereby offering a high stiffness-to-weight ratio resulting in significant weight savings.

It is still a further object of this invention to provide an improved solar concentrator system which is economical to produce and which utilizes conventional, currently available components that lend themselves to standard mass producing manufacturing techniques.

For a better understanding of the present invention, together with other and further objects thereof, reference is made to the following description taken in conjunction with the accompanying drawing and its scope will be pointed out in the appended claims.

DETAILED DESCRIPTION OF THE DRAWING

DETAILED DESCRIPTION OF THE PREFERRED EMBODIMENT

Figure 1:
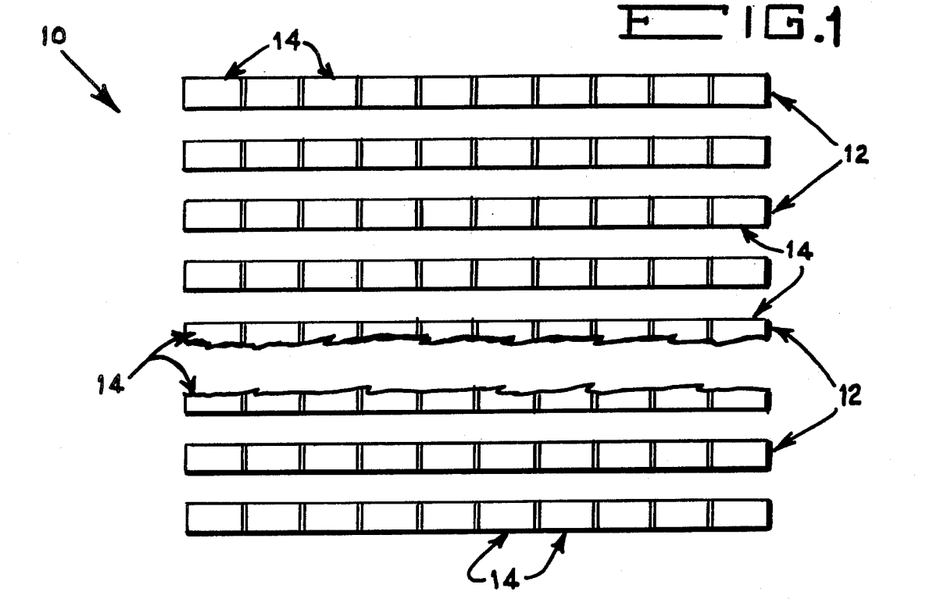
FIG. 1 is a plan view of the improved solar energy concentrator system of this invention shown in array fashion and partially segmented.

Reference is now made to FIG. 1 of the drawing which shows a plan view of the improved solar energy concentrator system 10 of this invention. The solar energy concentrator system 10 is made up of a plurality of rows of concentrator arrays 12, each array being formed of a plurality of interconnected concentrator modules 14, forming a grid pattern situated in a location susceptible to direct normal solar energy. It should be noted that the number of rows of concentrator arrays 12 that may be utilized in solar energy concentrator system 10 of this invention may vary in accordance with the output needs of such a system.

Figure 2:
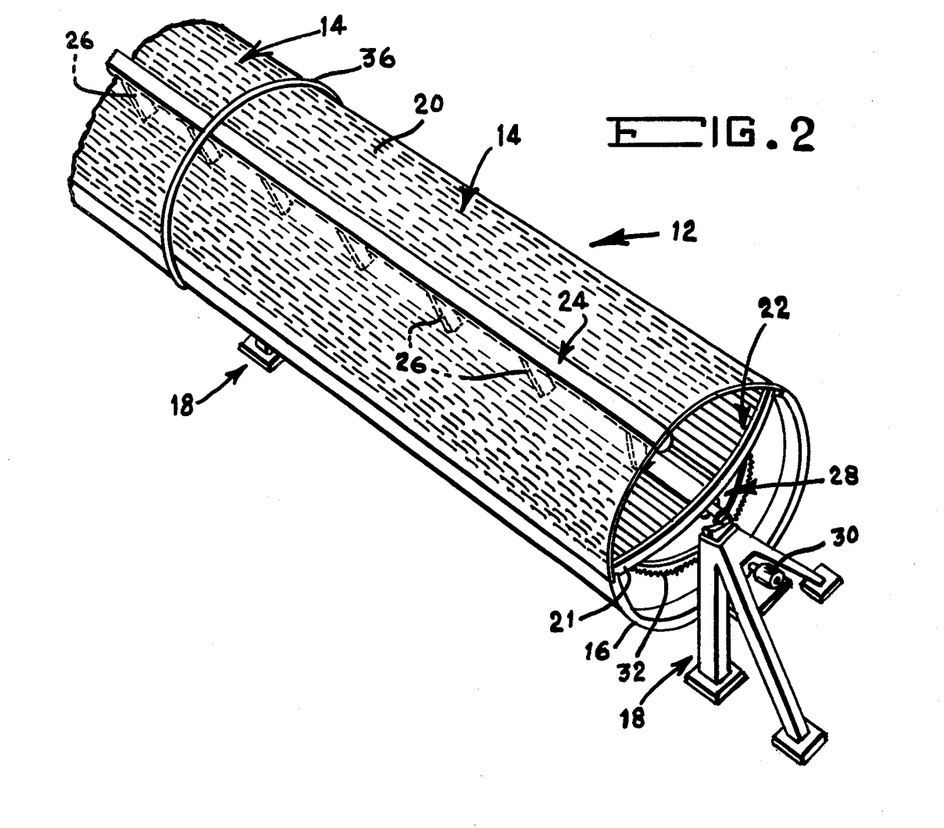
FIG. 2 is a pictorial representation of the improved solar energy concentrator system of this invention shown in segmented fashion.

Since each concentrator array 12 is identical to another, for ease of understanding of this invention, the remaining Figures of the drawing will be directed to only one such concentrator array 12, and, in most instances, to one of the concentrator modules 14, a plurality of which make up each concentrator array 12. FIG. 2 clearly depicts, in segmented, pictorial fashion, such a concentrator array 12.

Figure 3:
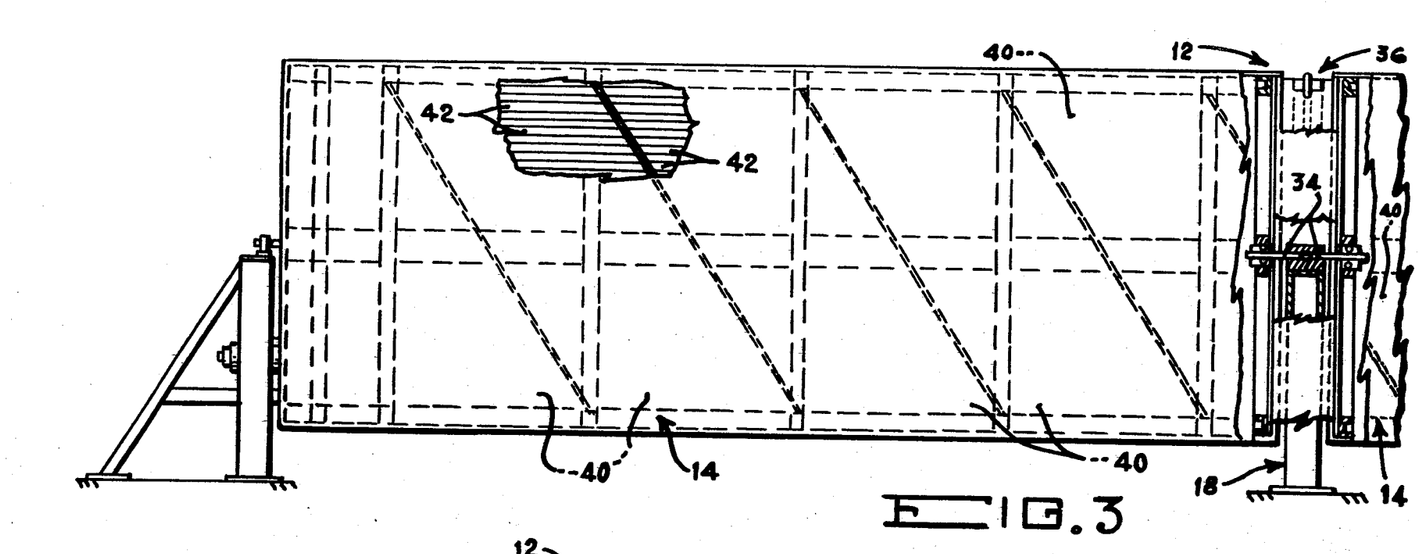
FIG. 3 is a side elevational view of the improved solar energy concentrator system of this invention shown in segmented fashion with the interconnection between adjacent concentrator modules shown in cross-section.
Figure 4:
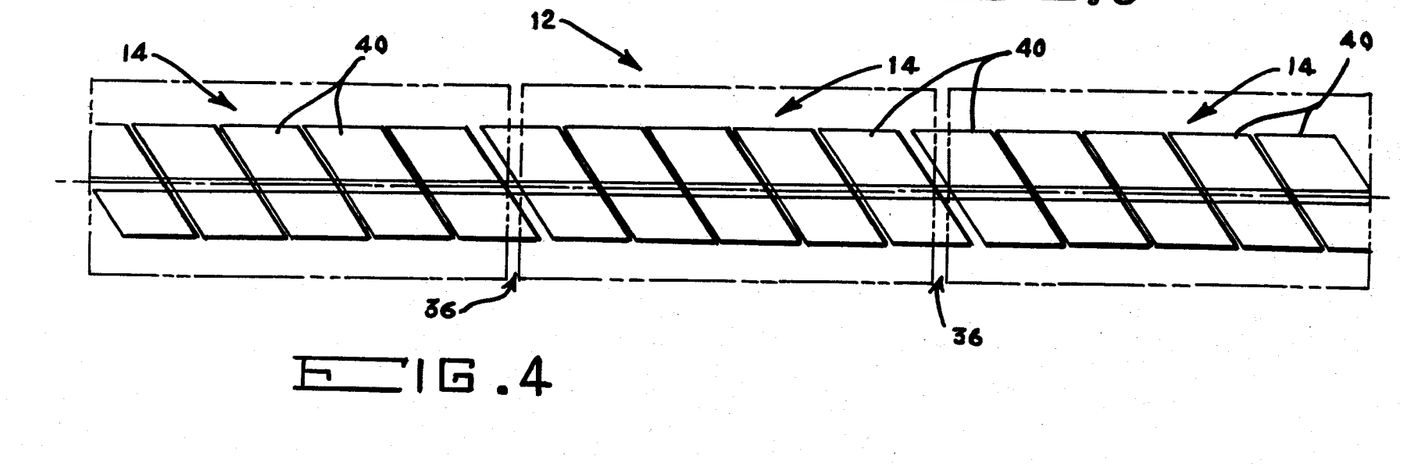
FIG. 4 is a schematic side elevational view of the solar energy concentrator system of this invention illustrating, in particular, the bias arrangement of the parallelogram-shaped reflecting panels.

Reference is now made to FIGS. 2 through 4 which more clearly illustrate a concentrator array 12 with specific emphasis being placed on the individual concentrator modules 14. As shown in these Figures each module 14 is made up of a longitudinal extending concentrator housing 16 rotatably supported at each end thereof by a supporting structure 18 described in greater detail hereinbelow.

A transparent removable cover 20 is mounted upon housing 16 and together therewith forms a preferably cylindrical, highly aerodynamic configuration. A frame 21 (shown in FIG. 5) located within housing 16 and situated within cover 20 supports a parabolically-shaped concentrator 22, the details of which will be set forth hereinbelow. A longitudinal extending solar energy receiver 24 (shown in FIGS. 2, 5 and 6 of the drawing) is centrally supported upon frame 21 under cover 20 by a plurality of support struts 26. Receiver 24 is made up of an array 25 of solar cells 27, the specific makeup thereof being set forth below.

With reference once again to FIGS. 2 and 5, cover 20 is made of a material which is transparent to the wavelength of interest, that is, the wavelength of the solar energy emitted from the sun. A preferred material for such a cover 20 would be a thin acrylic sheet which not only has good structural integrity over a large temperature range but also has good anti-wetting and anti-absorption properties. Utilizing an acrylic cover 20 having a daily average transmissivity of 90% with this invention would produce less than 5% discoloration over 20 years. Substantial inclement weather including up to 100 mile per hour winds could be sustained by the cylindrically-configured concentrator design of this invention. In fact, continuous operation could be maintained even with winds up to 50 miles per hour on clear days.

As shown in FIGS. 2 and 3 of the drawing the plurality of modules 14 of each concentrator array 12 are supported at the ends thereof by supporting structures 18 which allow rotational movement of the plurality of modules 14 to take place. Any suitable driving mechanism 28 in the form of, for example, a motor 30 and suitable gearing arrangement 32 operably connected to end support 18 permits appropriate rotation of modules 14 to take place. The driving mechanism 28 is utilized in conjunction with conventional control means (not shown) to cause the concentrator modules 14 to automatically track the sun in a manner well known in the art as the earth rotates.

More specifically, modules 14 are interconnected to each other by centrally located rods 34 as illustrated in FIG. 3. Rods 34 are maintained in rotatable position within the supporting structures 18. As with prior solar energy systems, the solar energy concentrator system 10 of this invention has each concentrator array 12 made up of a plurality of modules 14 rather than a single large unit, since each module 14 is generally approximately 20 feet in length and would be virtually impossible to support if made as a single unit.

As a result of the mounting arrangement shown clearly in FIG. 3, a gap or space 36 is formed between adjacent modules 14. This space 36 accounts for the cell shadowing problems which have been encountered in the past and described in detail in the background of the invention. In order to overcome this problem the present invention has incorporated therein a uniquely designed concentrator 22, the details of which will be set forth hereinbelow.

Figure 5:
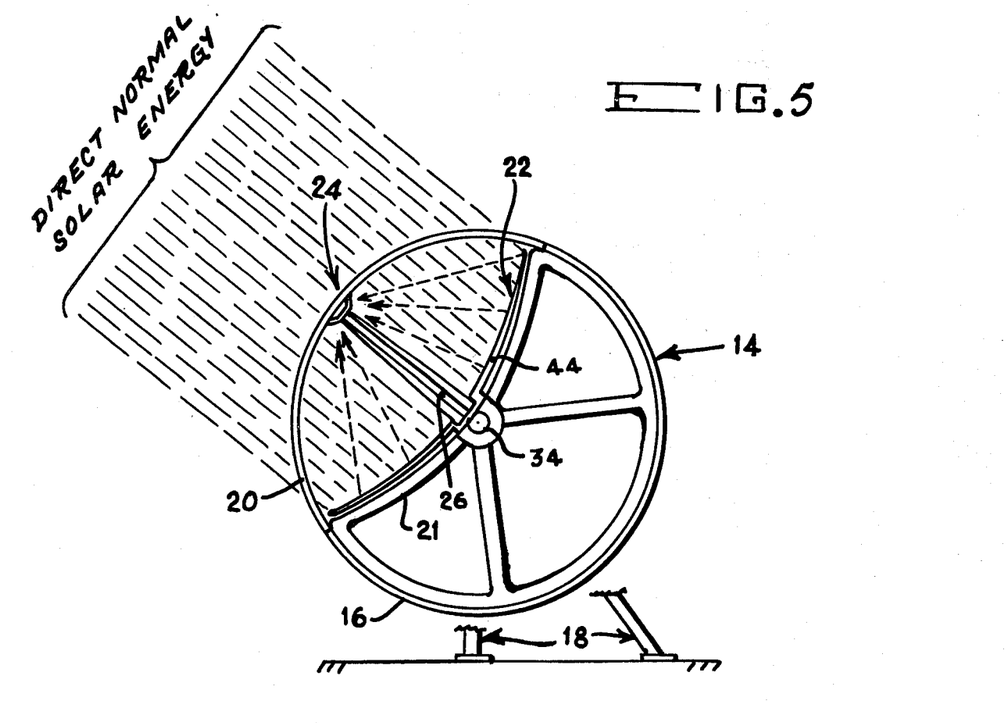
FIG. 5 is an end view of one of the concentrator modules of the improved solar energy concentrator system of this invention.
Figure 6:
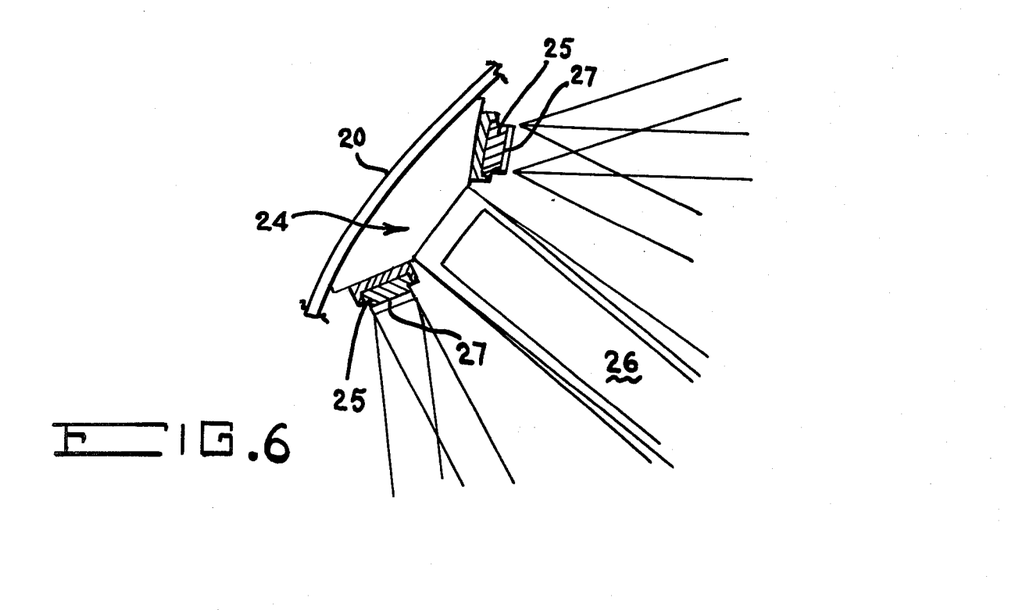
FIG. 6 is a cross-sectional view of the photovoltaic cells of the improved solar cell arrays of the improved solar energy concentrator system of this invention.
Figure 7:
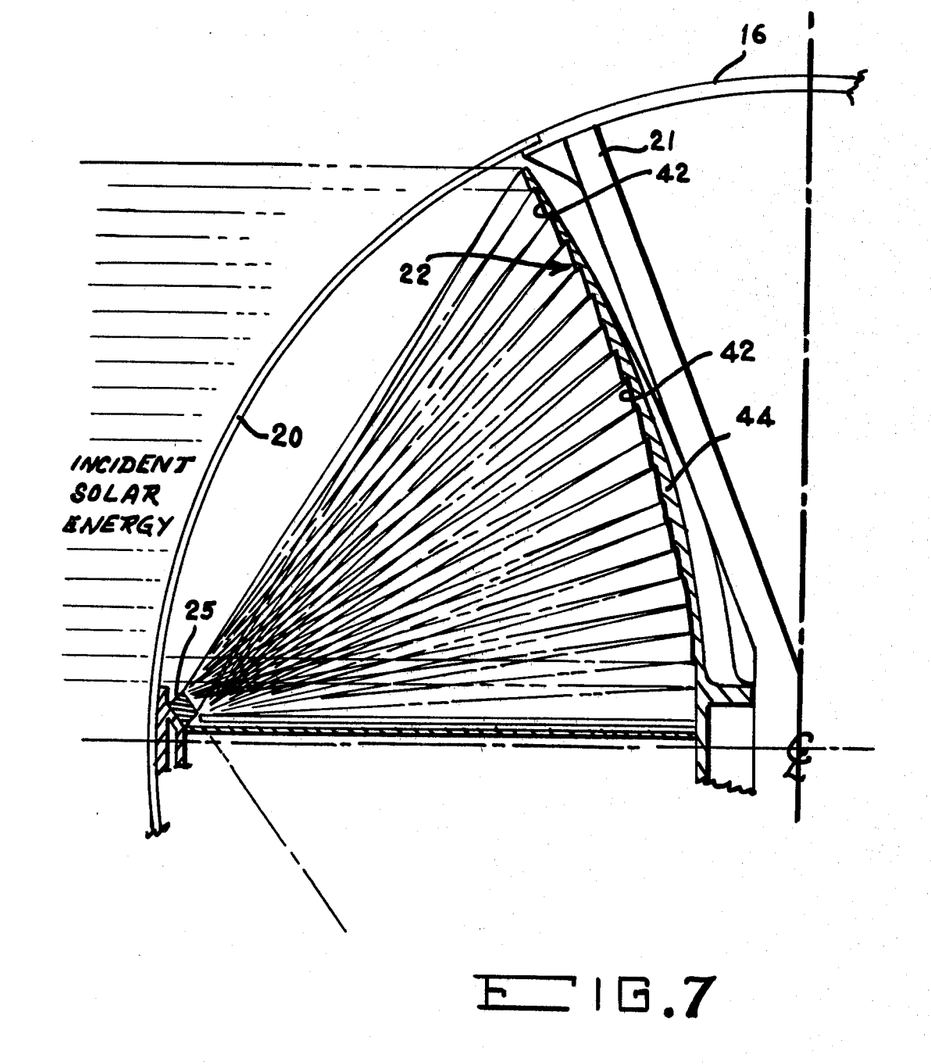
FIG. 7 is a partial, cross-sectional view of the improved solar concentrator system of this invention illustrating rays which are reflected from the reflective surface of the concentrator onto the photovotaic cells.

As shown in FIGS. 5-7 of the drawing, concentrator 22 is parabolically-shaped and designed so as to redirect incident solar energy onto the longitudinal extending solar energy receivers 24. Each receiver 24 is in turn made up of a pair of spaced parallel, longitudinally extending conventional solar or photovoltaic cell arrays 25. Each cell array 25 is composed of a plurality of individual solar cells 27 connected in series, with each array 25 being preferably 20 feet in length. Receiver 24 has an aperture plane established at preferably 60° to the focal axis of concentrator 22. This attitude will bound the acceptance angle of the irradiated energy from 0 degrees to 28 degrees.

Each concentrator array 12 is shown as having ten modules 14 which, therefore would contain a series string of 48 cells 27. It should, however, be realized that the number of modules 14 in an array 12 may vary in accordance with the energy requirements. Cells 27 are preferably in the form of photovoltaic cells of 2.0×1.990 inches and are capable of convering an irradiated peak flux density of 24 suns. As a result of cover 20 which encapsulates concentrator 22 and receiver 24 it is possible to eliminate individual encapsulation requirements of the environmentally exposed cells 27.

The enclosure design of this invention will effectively seal out the external inclement weather so that in effect cells 27 are less costly, gain in cell performance and access for replacement and/or jumping inoperative cells is more available.

Referring now to FIGS. 3 and 4 of the drawing, each concentrator 22 is made up of a plurality of identical reflector panels 40. The reflector panels 40 are made of a parallelogram-shaped configuration and mounted adjacent one another on a bias in order to form concentrator 22. In this manner, panels 40 of each module 14 can overlap the space 36 between adjacent modules 14, thereby eliminating the problem of shadowing.

Each of the panels 40 as illustrated in FIGS. 7-10 are formed of a parabolically-shaped sub-frame 44 mounted upon main frame 21 as shown in FIGS. 5 and 7 of the drawing. A plurality of longitudinally extending reflector strips 42 are positioned in overlapping relationship with respect to one another in a direction transverse to the longitudinally extending direction upon sub-frame 44 as clearly illustrated in FIGS. 7, 9 and 10 of the drawing. The reflector strips 42 are configured so as to each direct a predetermined amount solar energy to the photovoltaic cell arrays 25. A typical width for each reflector strip 42 (although not limited thereto) could be 1 7/16 inches. The offset 43 (FIGS. 8 and 9) between strips 42 allows for the overlapping of the individual reflector strips 42 and thereby presents a reflective surface capable of reflecting 100% of the incident solar energy.

Reflector strips 42 for approximately 95% reflectivity and are made of any conventional silvered material such as Corning Microsheet Glass. The reflector strips 42 are bonded to molded sub-frame 44 which is preferably made of a structural foam such as polyurethane. The disparity of coefficients of thermal expansion between the glass of reflector strips 42 and the foam sub-frame 44 necessitates the intervention of a barrier in the form of, for example, an aluminum substrate 45 therebetween in order to ameliorate the differential expansion which arises between the two materials.

Figures 8, 9:
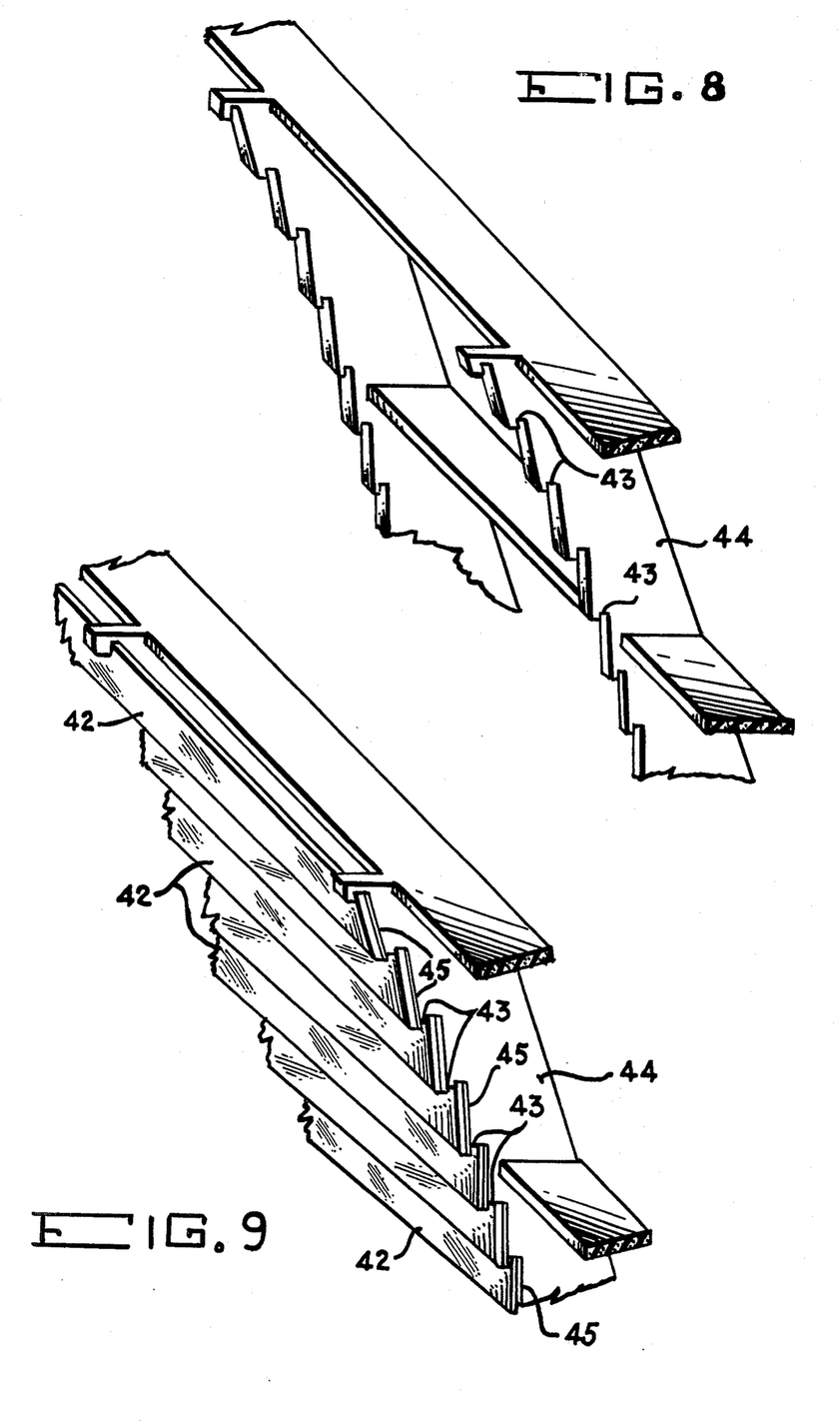
FIG. 8 is a pictorial representation of the supporting structure for the reflecting elements making up the concentrator of the improved solar energy concentrator system of this invention and shown in segmented fashion.
FIG. 9 is a pictorial representation of the reflecting elements in place within the supporting structure of the concentrator of the improved solar energy concentrator system of this invention and shown in segmented fashion.
Figure 10:
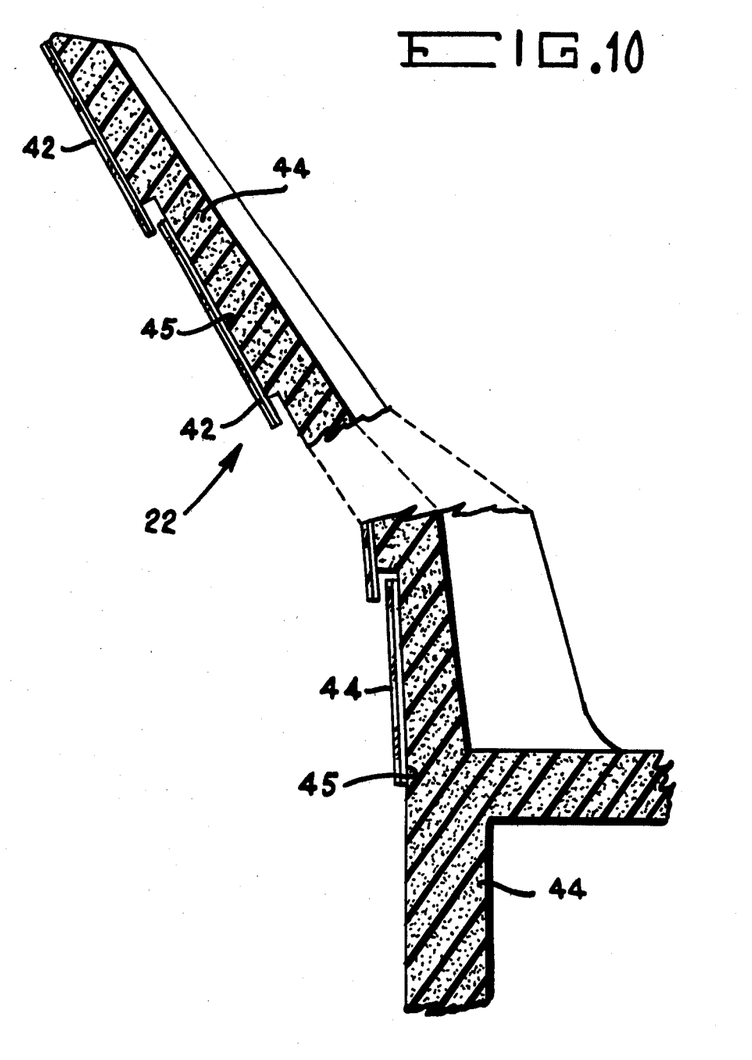
FIG. 10 is a partially segmented cross-sectional view of the supporting structure for the concentrator of the improved solar energy concentrator system of this invention with the reflecting elements in place.

As shown in FIGS. 8 and 9 of the drawing sub-frame 44 is made of an egg crate structural configuration and has been established both with structural integrity and heat transfer considerations. This design provides a more effective conductive path for the thermal energy absorbed by the reflecting strips 42 and the aluminum substrate 45. In fact, approximately 97% of the aluminum substrate 45 is directly exposed to air from the cool side of sub-frame 44.

MODE OF OPERATION

The improved solar energy concentrator system 10 of this invention as illustrated in FIG. 1 of the drawing is made up of a plurality of concentrator arrays 12 composed of a series of ten concentrator modules 14 structurally and mechanically interconnected. The orientation of arrays 12 are aligned such that concentrators 22 will track the sun about a horizontal east-west axis. By combining the ten modules 14 a totally integrated contiguous concentrator surface is capable of irradiating the solar incident energy to solar receiver 24 at as nearly a uniform level of illumination as possible. Such an arrangement produces a maximum output.

The flux distribution is uniform across the image width as well as cells 27 of receiver 24. Shading at the module interfacing has been modulated by the bias design of panels 40 illustrated in FIGS. 3 and 4 of the drawing. Such a design results in losses being distributed over the length of the cell array 25 rather than a single cell 27. Consequently, power losses due to shading or cell mismatch have been essentially eliminated so that maximum cell efficiency and cell performance can be attained. The use of blocking diodes and associated complex circuitry for cutting out shaded cells are therefore not required.

The highly efficient overall cylindrical design of the structure of this invention, which incorporates therein cover 20, is capable of maximum operation even with a 60 mph wind loading. Such conditions would yield a deflection of only 0.009 inches at the midpoint of module 14. This deflection is immeasurably small and will no way cause distortions in panels 40 and reflectors 42.

An operative example of the solar energy concentrator system 10 of this invention in order to provide a 1 Mw peak output includes 15 aligned rows of concentrator arrays 12 per acre for a total of 150 modules 14.

Power output per acre equals $150 \times 1.214 = 182$ Kw
Number of acres $= 1,000/182 = 5.50$ acres
Number of modules $= 5.5 (150) = 825$
The yearly production $= 2,458,500$ KwH.

Although this invention has been described with reference to a particular embodiment, it will be understood that this invention is also capable of further and other embodiments within the spirit and scope of the appended claims.

I claim:

1. A solar energy concentrator system comprising:
   (a) at least one row of concentrator arrays;
   (b) each of said concentrator arrays including a plurality of spaced adjacent longitudinally extending concentrator modules;
   (c) means interconnected between said adjacent concentrator modules for rotatably supporting said concentrator modules as a unit;
   (d) means operably connected to each end of each of said concentrator arrays for supporting each of said concentrator arrays and for providing controlled rotational movement thereto;
   (e) each of said plurality of concentrator modules having a semi-cylindrically-shaped housing and a semi-cylindrically-shaped cover secured thereto thereby forming a cylindrically-shaped concentrator module, said cover being made of a material being transparent to the wavelength of said solar energy;
   (f) means connected to said housing and situated within said cover for receiving said solar energy and for concentrating and directing said solar energy in a predetermined direction, said solar energy receiving and concentrating means including at least one reflector panel, said reflector panel being in the shape of a parallelogram, and means connected to said reflector panel for securing said reflector panel to said housing such that each end of said panel extends a predetermined distance into said space between said adjacent concentrator modules; and
   (g) means mounted within said cover in optical alignment with said predetermined direction for receiving said concentrated solar energy and for converting said solar energy into electrical power.

2. A solar energy concentrator system comprising:
   (a) at least one row of concentrator arrays;
   (b) each of said concentrator arrays including a plurality of spaced adjacent longitudinally extending concentrator modules;
   (c) means interconnected between said adjacent concentrator modules for rotatably supporting said concentrator modules as a unit;
   (d) means operably connected to each end of each of said concentrator arrays for supporting each of said concentrator arrays and for providing controlled rotational movement thereto;
   (e) each of said plurality of concentrator modules having a semi-cylindrically-shaped housing and a semi-cylindrically-shaped cover secured thereto thereby forming a cylindrically-shaped concentrator module, said cover being made of a material being transparent to the wavelength of said solar energy;
   (f) means connected to said housing and situated within said cover for receiving said solar energy and for concentrating and directing said solar energy in a predetermined direction, said solar energy receiving and concentrating means including a plurality of adjacent reflector panels, each of said reflector panels being in the shape of a parallelogram, and means connected to said reflector panels for securing said reflector panels to said housing on a bias such that the ends of said panels adjacent the ends of said housing of each of said concentrator modules extend a predetermined distance into said space between said adjacent concentrator modules; and
   (g) means mounted within said cover in optical alignment with said predetermined direction for receiving said concentrated solar energy and for converting said solar energy into electrical power.

3. A solar energy concentrator system as defined in claim 1 wherein each of said reflector panels comprises a plurality of longitudinally extending reflector strips, and said panel securing means mounting said reflector strips in overlapping fashion adjacent one another in a direction transverse to said longitudinal direction.

4. A solar energy concentrator system as defined in claim 3 wherein said panel securing means comprises a frame made of a material having good insulation properties and means interposed between said frame and said reflector strips for compensating for the difference in thermal properties between said reflector strips and said frame.

5. A solar energy concentrator system as defined in claim 4 wherein said solar energy converting means comprises a plurality of longitudinally extending solar cells.

6. A solar energy concentrator system as defined in claim 5 wherein said frame is made of a molded foam material and said compensating means is made of an aluminum substrate.

7. A solar energy concentrator system as defined in claim 6 wherein said concentrator is formed of a parabolically-shaped configuration.

8. A solar energy concentrator system as defined in claim 7 further comprising a plurality of concentrator rows.

9. A solar energy concentrator system as defined in claim 8 wherein said cover is made of a thin sheet of acrylic material.

* * * * *